(12) United States Patent
Jeong

(10) Patent No.: US 7,277,490 B1
(45) Date of Patent: Oct. 2, 2007

(54) APPARATUS FOR CONVERTING PCM SIGNAL

(75) Inventor: Chang-Rae Jeong, Seoul (KR)

(73) Assignee: Samsung Electronics Co., Ltd., Yeongtong-Gu, Suwon-Si, Gyeonggi-Do (KR)

( * ) Notice: Subject to any disclaimer, the term of this patent is extended or adjusted under 35 U.S.C. 154(b) by 0 days.

(21) Appl. No.: 09/350,436

(22) Filed: Jul. 9, 1999

(30) Foreign Application Priority Data

Jul. 11, 1998 (KR) ................................ 1998-28061

(51) Int. Cl.
*H04B 14/04* (2006.01)
(52) U.S. Cl. .................. 375/242; 375/222; 375/241; 341/50; 341/183
(58) Field of Classification Search ................ 375/222, 375/242, 231, 295, 340, 241, 354, 249; 379/27.01; 341/75, 50, 183; 370/471, 426, 241, 271, 370/378; 445/445
See application file for complete search history.

(56) References Cited

U.S. PATENT DOCUMENTS

| | | | | |
|---|---|---|---|---|
| 3,825,924 A | * | 7/1974 | Montgomery | ................ 341/75 |
| 5,303,191 A | * | 4/1994 | Eagan et al. | ................ 365/194 |
| 5,652,782 A | * | 7/1997 | Hughes-Hartogs | ....... 379/27.01 |
| 5,887,027 A | * | 3/1999 | Cohen et al. | ................ 375/222 |

\* cited by examiner

*Primary Examiner*—Dac Ha
*Assistant Examiner*—Ted M. Wang
(74) *Attorney, Agent, or Firm*—Cha & Reiter, L.L.C.

(57) ABSTRACT

An apparatus for converting pulse code modulation (PCM) signals in a telecommunication system between two different modulation standards. In the apparatus, a channel selector generates a channel select signal for identifying at least one channel of the multiple channels containing input digital signals modulated by said one of said two different modulation standards. A first codec demodulates a signal on a channel designated by the channel select signal which is modulated by the first modulation standard, into an analog signal to be supplied to a second codec, which modulates the converted analog signal input into a digital signal using the second modulation standard. The reverse process is executed in a similar manner. A second codec using the second modulation standard demodulates a digital signal on the channel designated by the channel select signal into an analog signal to be supplied to the first codec, and the first codec in turn modulates the converted analog signal into a digital signal using the first modulation standard. As a result, the present invention is able to convert pulse code modulation signals from either one of two different modulation standards to the other one of said two different modulation standards in a telecommunication system.

9 Claims, 4 Drawing Sheets

APPARATUS FOR CONVERTING PCM SIGNAL

CLAIM OF PRIORITY

This application makes reference to, incorporates the same herein, and claims all benefits accruing under 35 U.S.C. §119 accruing from an application entitled, *PCM CONVERTER*, earlier filed in Korean Industrial Property Office of Jul. 11, 1998, and there duly assigned Ser. No. 1998-28061.

BACKGROUND OF THE INVENTION

1. Field of the Invention

The present invention relates to an apparatus for converting pulse code modulation (PCM) signal, and more particularly, the present invention relates to a PCM signal conversion apparatus capable of providing compatibility between two different coding standards, namely, A-law and μ-law in a communication system.

2. Description of the Related Art

A device typically found in digital communication systems is a converter for converting an analog signal to a digital signal. Typically, PCM technique is implemented for converting an analog signal to a digital signal. The PCM signal contains a plurality of groups of multi-bit digital signals constituting a series of multi channel signals. The PCM technique can be classified into two types of coding, A-law PCM coding (simply called A-law coding herein after), which is widely used in Europe, and μ-law PCM coding (simply called μ-law coding hereinafter), which is widely used in US and Japan.

Currently, the A-law coding and the μ-law coding are both widely used in many countries, as a result, there is a demand for a separate device for interfacing between the A-law coding and the μ-law coding.

FIG. 1 illustrates a conventional code conversion circuit of the type having a ROM (read only memory) for receiving at its address input, a digital trunk card including a time switch/digital signal processor (DSP) (called a time switch/DSP hereinafter), a main control card including a main time switch, and a digital trunk, and the circuit used for converting the signals encoded by different coding standards.

Referring to FIG. 1, the system employs the μ-law coding, wherein signals B and D represent A-law modulated (or encoded) signals and signals A and C represent μ-law modulated signals. A digital signal from an office line is supplied to the main time switch 112, passing through a digital trunk 124 and a time switch/DSP 122. The time switch/DSP 122 converts the A-law modulated signal B into the μ-law modulated signal A. The time switch/DSP 122 first receives the A-law modulated code value B and outputs a stored μ-law modulated value corresponding to the received A-law modulated signal B as linear code value, and then replaces the linear code with corresponding μ-law modulated value from an pre-determined internal memory table. Accordingly, the A-law modulated signal B is converted into the μ-law modulated signal A and subsequently transmitted to a main control card 110.

In contrast, when a signal is output to the office line from the system, the μ-law modulated signal C output from the main control card 110 is applied to the time switch/DSP 122. The time switch/DSP 122 then converts the μ-law modulated signal C into corresponding A-law modulated signal D from the pre-determined internal memory table using the above process in reverse order. As a result, the converted A-law modulated signal D is supplied to the office line via the digital trunk 124.

All the signals, A, B, C and D, as shown in the FIG. 1, are digital signals (or PCM signals). The signals A and C represent the μ-law modulated signals while the signals B and D represent the A-law modulated signals. As shown, the above known converter indiscriminately converts every channel signal in the multi-channel signals. However, it has the some disadvantages in operating that way. First, the design of the above conversion apparatus is complicated, which results in a high fabrication cost and complicates the overall size of the system. Moreover, since all the channel signals of the multi-channel signals are converted indiscriminately, it is not suitable for selectively converting only one or two channel signals of the multi channel signals.

SUMMARY OF THE INVENTION

It is therefore an object of the present invention to provide an economical conversion apparatus capable of providing compatibility between two different coding standards with respect to only selected channels.

To achieve the above objects, there is provided an apparatus for converting PCM signals in a system between two different modulation standards, namely A-law and μ-law. Such apparatus includes a channel selector for generating a channel select signal to designate at least one channel signal in multi-channel system. A plurality of input digital signals are received in different channel signals. The apparatus further comprising a first codec for demodulating the input digital signal, modulated by the first modulation standard in response to the channel select signal, into an analog signal which is to be supplied to a second codec, and for modulating an analog signal input from the second codec into digital signal to be modulated by the first modulation standard; the second codec for demodulating the signal, modulated by a second modulation standard in response to the channel select signal, into an analog signal which is to be supplied to the first codec and for modulating the analog signal input from the first codec into digital dignal to be modulated by the second modulation standard.

A first mixer having a first buffer and a second buffer for selectively operating in response to a first mixing control signal generated from the channel selector, and a second mixer having a third buffer and a fourth buffer for selectively operating in response to a second mixing control signal generated from the channel selector, wherein the first buffer for receiving the first input digital signal from the second codec responsive to channel select signal, a second buffer sharing an output terminal of the first buffer for receiving the digital signal supplied to the first codec wherein the first and second buffers operate complementarily to each other, a third buffer for receiving the digital signal output from the first codec responsive to the channel select signal, and a fourth buffer sharing an output terminal with the third buffer for receiving a second input digital signal supplied to the second codec and the third and fourth buffers operate complementarily to each other.

DETAILED DESCRIPTION OF THE PREFERRED EMBODIMENT

Figure 1:
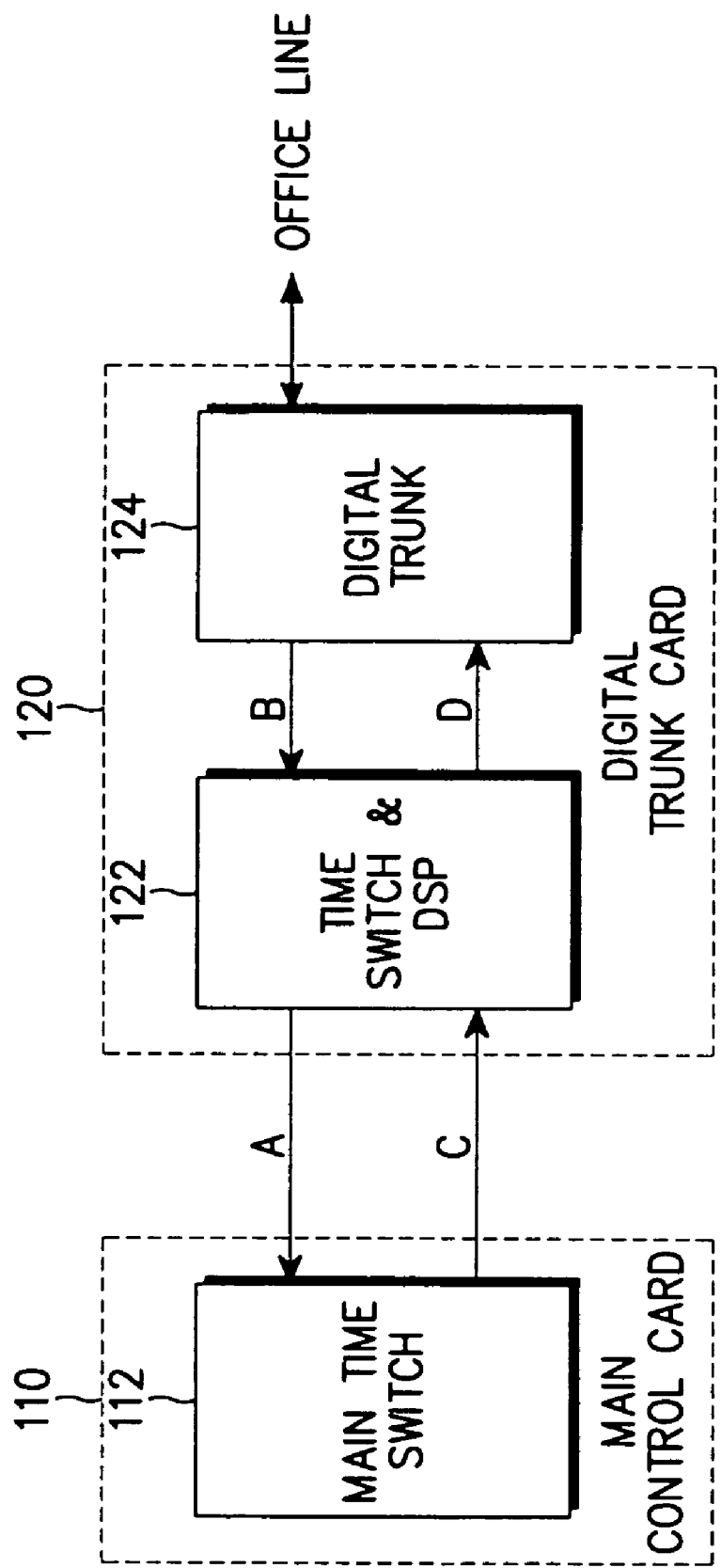
FIG. 1 is a block diagram of a common PCM system.

A preferred embodiment of the present invention will be described hereinbelow with referent to the accompanying drawings. There are a 32-channel PCM signal and a 24-channel PCM signal, and the present invention incorporates the 32-channel PCM signal as an illustrative example, and all PCM signals would be referred to as a digital signal. Furthermore, the description of various features and structures of the present invention that are known to one skilled in the art are omitted for the sake of clarity and brevity. The present invention provides a codec apparatus as shown in FIG. 2, which replaces the time switch/DSP 122 of the FIG. 1, for converting a digital signal to the converted analog signal and an analog signal to a digital signal.

Figure 2:
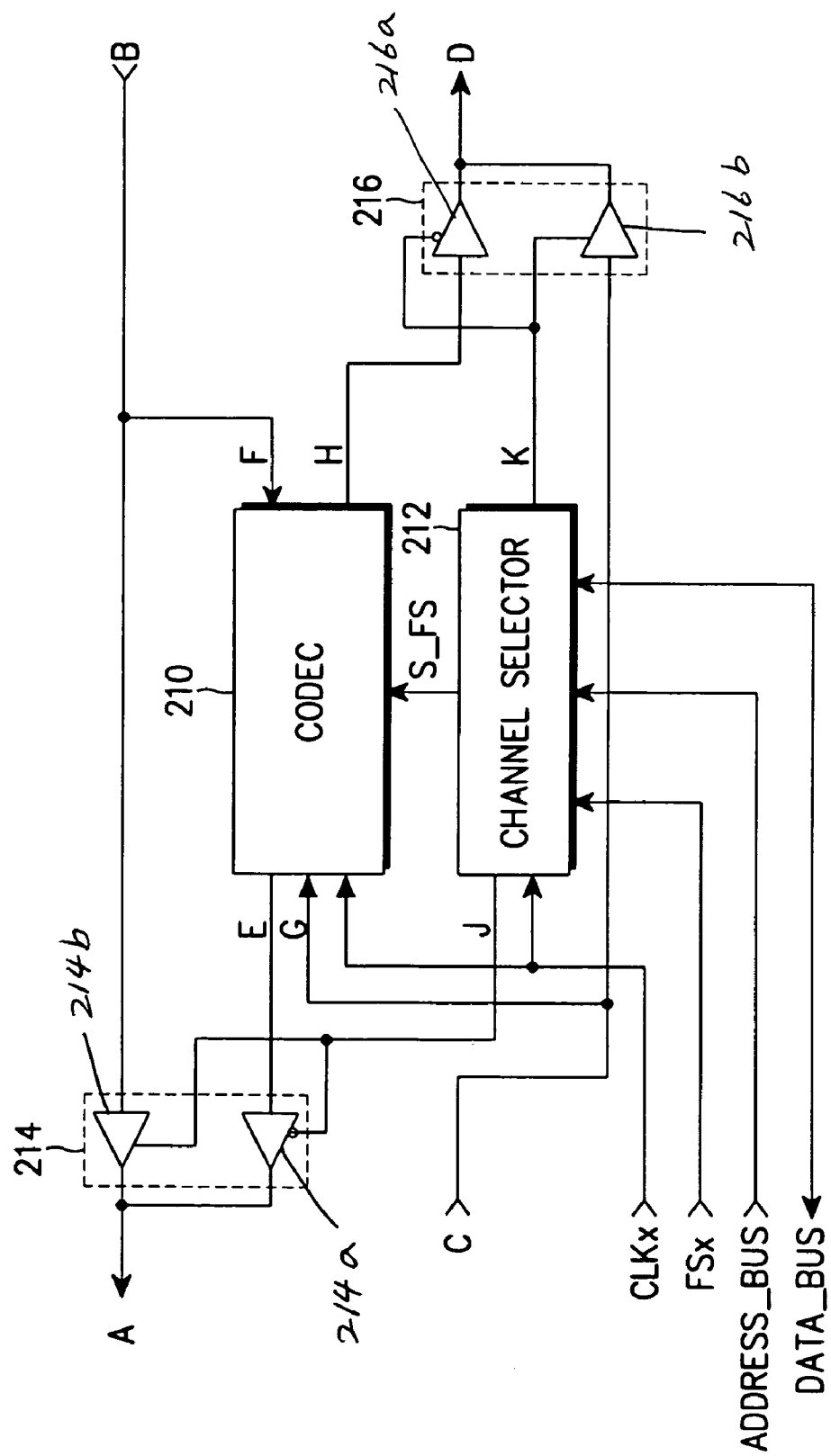
FIG. 2 is a diagram illustrating a structure of a conversion apparatus according to an embodiment of the present invention.

Referring to FIG. 2, the codec apparatus includes a codec 210, a channel selector 212 for generating a channel select signal, S_FS and a first mixer 214 and a second mixer 216. The channel selector 212 outputs the channel select signal S_FS and mixing control signals J and K, which are controlled by a clock signal CLKx, a frame sync signal FSx, an read address, and data input. One skilled in art would know that there are various ways and type of circuits served to provide an address generator controlled by a clock signal from a clock domain, which can generate read address for reading out data from the data storage elements. The codec 210 has input/output terminals for receiving and supplying the A-law modulated digital signals B and D, respectively, and input/output terminals for receiving and supplying the Φ-law modulated digital signals A and C, respectively. The codec 210 selectively converts a specified channel signal from the modulated multi channel signals in response to the channel select signal, S_FS generated by the channel selector 212. The first mixer 214 includes two buffers operating complementarily to each other in response to the mixing control signal J, a first buffer 214a for storing the digital signal output E from the codec 210 and a second buffer 214b for storing the original digital signal B. Similarly, the second mixer 216 consists of two buffers operating complementarily to each other in response to the mixing control signal K, a third buffer 216a for storing the digital signal output H from the codec 210 and a fourth buffer 216b for storing the original digital signal C. Each pair of the buffers in each mixer share the output terminal and operate complementarily to each other in such a manner that first buffer is enabled while the second buffer is disabled, and vice versa.

Figure 3:
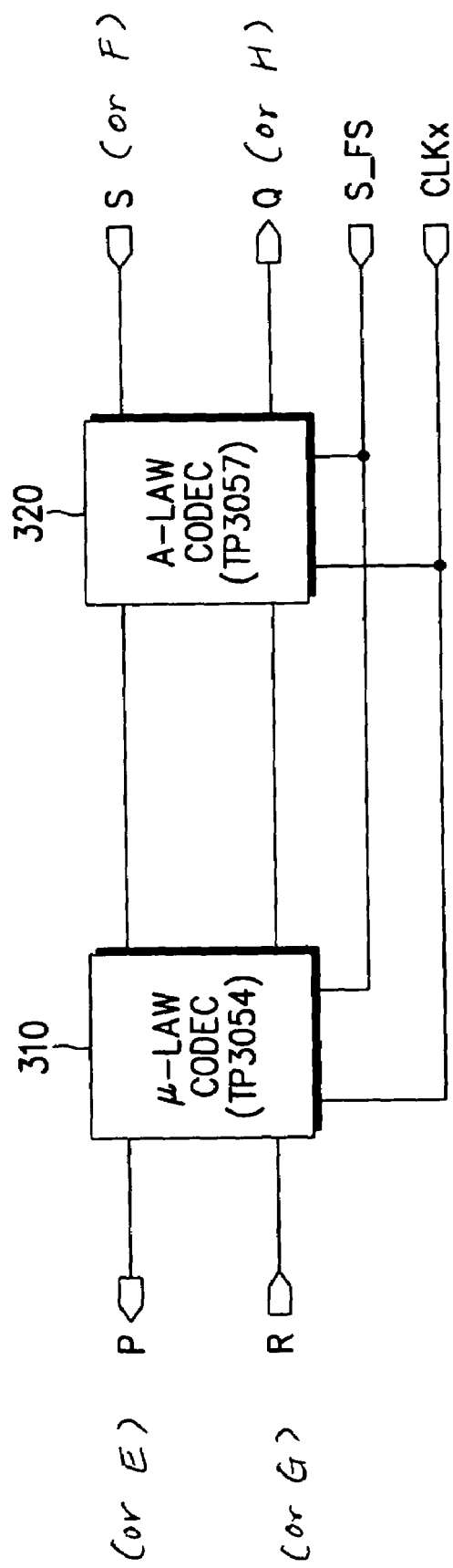
FIG. 3 is a detailed diagram illustrating a structure of a codec (210) of the FIG. 2 according to an embodiment of the present invention.

Referring to FIG. 3, the codec 210 consist of an A-law codec 320 and a µ-law codec 310, the digital signals S and Q represent A-law modulated signals and digital signals P and R represent µ-law modulated signals. The present invention incorporates extensively used commercial codec, as an example illustration, since these are inexpensive and easily available. However, those skilled in art would know that other equivalent commercial codec can be incorporated to make the present invention to work to achieve the same objects and goals of the present invention. Accordingly, the preferred embodiment incorporates a commercial codec TP3057 for A-law codec. The A-law codec 320 demodulates the A-law modulated digital signal S into an analog signal to be supplied the µ-law codec 310, and also modulates an analog signal output received from the µ-law codec 310 into the A-law modulated digital signal. The present invention incorporates a commercial codec TP3054 as the µ-law codec 310. The µ-law codec 310 demodulates the µ-law modulated digital signal R into analog signal to be supplied to the A-law codec 320. Also, it modulates the analog signal output from the A-law codec 320 into the µ-law modulated digital signal P. The µ-law codec 310 and A-law codec 320 determine which channel signals of the multi channels to be modulated or demodulated in response to channel select signal S_SF from the signal channel selector 212 and modulate or demodulate the determined channel in response to CLKx.

Figure 4:
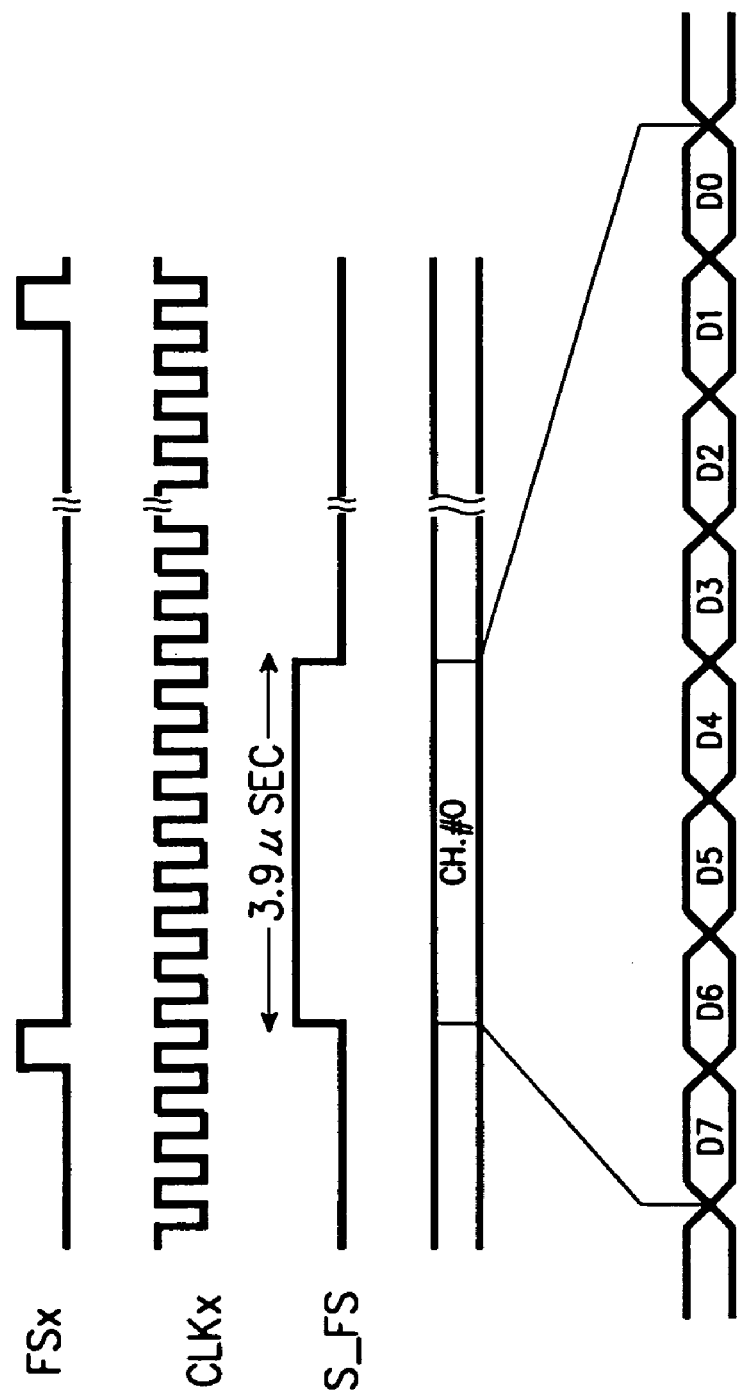
FIG. 4 is a diagram illustrating waveforms of the respective signals used in the conversion apparatus according to the present invention.

FIG. 4 illustrates waveforms of the respective signals used in the codec apparatus according to the present invention as follow: the frame sync signal (FSx), the clock signal (CLKx), the channel select signal (S_FS), and a 8 bit signal ranging from 0 bit to 7 bit (D0-D7) constituting one channel. As shown in FIG. 4, one channel has time duration of 3.9 µsec and accordingly, the channel select signal also has time duration of 3.9 µsec. The channel selector 212 generates the channel select signal (S_FS) using the frame sync signal (FSx), the clock (CLKx), the address input via an address bus and the data input via a data bus.

In the specification, the description will be given on the assumption that the signals B and D are A-law modulated digital signals, and the signals A and C are µ-law modulated digital signals. In such condition, the signals A and C represent µ-law modulated (or encoded) signals and the signals B and D represent A-law modulated signals, the signals, F, H, E and G of FIG. 2 corresponds to the signals S, Q, P and R of FIG. 3, respectively. However, it will be understood by those skilled in this art that the invention can be applied to such different embodiments where the signals B and D are µ-law modulated digital signals and the signals A and C are A-law modulated digital signals. In the later embodiments, the signals A and C are considered to be the A-law modulated signals and the signals B and D are µ-law modulated signals, the signals F, H, E and G of FIG. 2 would correspond to the signals, R, P, Q and S of FIG. 3, respectively.

Now, a description will be given as to an operation of converting the A-law modulated signal B or F into the µ-law modulated signal E as shown in FIG. 2. The signal B is applied to a mixer 214 and the signal F identical to the signal B is applied to the codec 210. The codec 210 selects one channel to be converted from the signal F having multiple channels (e.g., 32 channels) in response to the channel select signal S_FS generated from the channel selector 212. The channel select signal S_FS is synchronized with the incoming channel signals constituting signal F. After selecting a specific channel in response to the channel select signal S_FS, the codec 210 converts the selected channel of the A-law modulated signal F (or B) into the µ-law modulated signal.

The above steps can be understood easily by the illustration shown in FIG. 3. Upon a reception of the signal S identical to the signal F, the A-law codec 320 demodulates one channel of the A-law modulated signal F selected by the channel select signal S_FS into an analog signal. The demodulated analog signal is then applied to the µ-law codec 310 which in turn modulates the analog signal to generate the μ-law modulated digital signal P which is identical to the signal E of FIG. 2.

Referring to FIG. 4, the channel select signal S_Fs, for selecting a specific channel, is synchronized with the period of one corresponding channel, and maintains a high state for 3.9 μsec. The channel select signal F_FS selects specific first frame, CH#0, in response to the frame sync signal FSx and one specific channel which contains the 8 bit signal ranging from 0 bit to 7 bit (D0-D7).

In the meantime, the channel select signal S_FS is supplied to the first mixer 214 as a mixing control signal J. For the duration of the signal J (i.e., 3.9 μsec), the first mixer 214 blocks an output path of the second buffer 214b of the first mixer 214 from transmitting the buffered B signal, and connects an output path of the first buffer 214a of the first mixer 214 for the transmission of the signal E. Thus, for the duration of the channel select signal S_FS (3.9 μsec), the first mixer 24 selectively outputs the signal E while cutting off the signal B received thereon. Accordingly, if the signal B comprises 32 channels, only one channel selected in response to the channel select signal S_FS, is modulated by μ-law coding, and the remaining 31 unselected channels are output to the first mixer 214 without any conversion operated thereon by the codec 210.

Referring to FIG. 2, a brief description will be given as to an operation of converting the μ-law modulated signal C (or G) into the A-law modulated signal H. Initially, the signal C is applied to the second buffer 216b of the second mixer 216, and the signal G (or C) is applied to the codec 210. The of the codec 210 selects a specific channel to be converted from the signal C, which comprises multiple channels (e.g., 32 channels), in response to the channel select signal S_FS generated from the channel selector 212. Then, the codec 210 converts the selected channel on the μ-law modulated signal G(or C) on the selected channel into the A-law modulated signal H.

More detailed functions of the codec 210 is further described by following the features shown in FIG. 3. Upon reception of the signal R identical to the signal G, the μ-law codec 310 demodulates the selected channel of the μ-law modulated signal R (or G) in response to the channel select signal S_FS into an analog signal. The demodulated analog signal is supplied to the A-law codec 320, in turn the A-law modulates the analog signal into the A-law modulated signal Q, which is identical to the signal H of FIG. 2.

In the meantime, the channel select signal S_FS is supplied to the second mixer 216 as a mixing control signal K. For the duration of the signal K (i.e., 3.9 μsec), the second mixer 216 blocks an output path of the second buffer 216b of the second mixer 216 from transmitting the stored signal C, but connects an output path of the first buffer 216a of the second mixer 216 for the transmission of the signal H. Thus, for the duration of the channel select signal S_FS (3.9 μsec), the second mixer 216 selectively outputs the signal H while cutting off the signal C. Accordingly, if the signal C has 32 channels, only one channel selected by the channel select signal is modulated by A-law coding and the remaining 31 unselected channels are output without any conversion operated thereon by the codec 210.

The present invention can convert one channel selected channels out of the A-law modulated channel signals into the μ-law modulated signal, and vice versa. That is, it provides compatibility between two different modulation standards. Although the invention has been described with reference to selectively modulating only one channel signal, it is also possible to selectively modulate maximum of four channel signals with the channel selector 212 of FIG. 2. In such case, the number of codec 210 and the mixers 214 and 216 should be increases as many as the number of the channels to be converted.

As described above, the present invention provides an apparatus for converting PCM signals which can selectively convert a number of selected channels from the multi channel signals using known commercial codec, and further helps to reduce the fabrication cost and the overall size of the system.

While the invention has been shown and described with reference to certain preferred embodiments thereof, it will be understood by those skilled in the art that various changes in form and details may be made therein without departing from the spirit and scope of the invention as defined by the appended claims.

I claim:

1. An apparatus for converting pulse code modulation (PCM) signals from either one of two different modulation standards to the other one of said two different modulation standards in a system characterized by having a plurality of communication channels with each channel having a plurality of input digital signals modulated by said one of said two different modulation standards, said apparatus comprising:
   a channel selector for generating a channel select signal for identifying one of said plurality of communication channels in said system;
   at least one codec means for selectively converting said identified input digital signals received in said one of said plurality of communication channels from said one of said two different modulation standards to the other one of said two different modulation standards in response to said channel select signal; and,
   a plurality of mixers for selectively releasing and transmitting said input digital signal modulated by said one of said two different modulation standards and said converted input digital signal to the other one of said two different modulation standards by said codec means in response to said channel select signal, wherein said mixer further comprises a first buffer for receiving said converted input digital signal by said other one of said two different modulation standards from said codec means, and a second buffer sharing an output terminal with said first buffer for receiving said input digital signal modulated by said one of said two different modulation standards.

2. The apparatus as set forth in claim 1, wherein said codec means further comprises:
   a first sub-codec means for converting said input digital signal modulated by said one of two different modulation standards received in said identified at least one channel of the multiple channels into an analog signal in response to said channel select signal, and
   a second sub-codec means for converting said converted signal by said first sub-codec means into corresponding digital signals in accordance with the other of said two different modulation standards in response to said channel select signal.

3. The apparatus as set forth in claim 1, wherein said channel select signal is generated in response to a frame sync signal, a clock signal, and a read address controlled by said clock signal for reading an output data.

4. The apparatus as set forth in claim 3, wherein said channel select signal is synchronized with said at least one channel of the multiple channels containing said input digital signals modulated by said one of said two different modulation standards.

5. An apparatus for converting pulse code modulation (PCM) signals from either one or two different modulation standards to the other one of said two different modulation standards in a system characterized by having a plurality of communication channels with each channel having a plurality of input digital signals modulated by said one of said two different modulation standards, said apparatus comprising:

a channel selector for generating a channel select signal for identifying one of said plurality of communication channels containing said input digital signals modulated by said one of said two different modulation standards;

a first codec means for selectively converting said input digital signal modulated by said one of two different modulation standards and received in said identified one of said plurality of communication channels into an analog signal in response to said channel select signal;

a second codec means for converting said converted analog signal by said first codec means into corresponding digital signals in accordance with the other of said two different modulation standards in response to said channel select signal; and a plurality of mixers for selectively releasing and transmitting said input digital signal modulated by said one of said two different modulation standards and said converted input digital signal to the other one of said two different modulation standards by said codec means in response to said channel select signal, wherein said mixer further comprises a first buffer for receiving said converted input digital signal by the other of said two different modulation standards by said second codec means, and a second buffer sharing an output terminal with said first buffer for receiving said input digital signal modulated by said one of said two different modulation standards.

6. The apparatus as set forth in claim 5, wherein said mixer further comprises a first mixer for selectively releasing and transmitting said input digital signal modulated by said one of said two different modulation standards and said converted input digital signal by the other of said two different modulation standards by said second codec means in response to said channel select signal, and a second mixer for selectively releasing and transmitting said input digital signal modulated by said one of said two different modulation standards and said converted input digital signal by the other of said two different modulation standards by said first codec means in response to said channel select signal.

7. The apparats as set forth in claim 6, wherein said second mixer further comprises:

a third buffer for receiving said converted input digital signal by the other of said two different modulation standards by said first codec means, and a fourth buffer sharing an output terminal with said first buffer for receiving said input digital signal modulated by said one of said two different modulation standards.

8. The apparatus as set forth in claim 5, wherein said channel select signal is generated in response to a frame sync signal, a clock signal, and a read address controlled by said clock signal for reading an output data.

9. The apparatus as set forth in claim 8, wherein said channel select signal is synchronized with said at least one channel of the multiple channels containing said input digital signals modulated by said one of said two different modulation standards.

* * * * *